(12) United States Patent
Peng et al.

(10) Patent No.: US 10,383,249 B1
(45) Date of Patent: Aug. 13, 2019

(54) SERVER

(71) Applicants: INVENTEC (PUDONG) TECHNOLOGY CORPORATION, Shanghai (CN); INVENTEC CORPORATION, Taipei (TW)

(72) Inventors: Ping-Wei Peng, Taipei (TW); Xiao-Ning Ding, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/153,728

(22) Filed: Oct. 6, 2018

(30) Foreign Application Priority Data

Sep. 21, 2018 (CN) .......................... 2018 1 1109746

(51) Int. Cl.
*H05K 7/14* (2006.01)
*H05K 7/20* (2006.01)

(52) U.S. Cl.
CPC ....... *H05K 7/1489* (2013.01); *H05K 7/20736* (2013.01)

(58) Field of Classification Search
CPC .......................... H05K 7/1485; H05K 7/1487
See application file for complete search history.

(56) References Cited

U.S. PATENT DOCUMENTS

| | | | |
|---|---|---|---|
| 8,120,922 B2* | 2/2012 | Randall | G11B 33/126 361/725 |
| 8,584,351 B1* | 11/2013 | Lu | H05K 13/0053 29/729 |
| 8,797,732 B2* | 8/2014 | Ganta Papa Rao Bala | G11B 33/128 361/679.32 |
| 9,070,419 B1* | 6/2015 | Zhu | H05K 7/1491 |
| 9,265,173 B1* | 2/2016 | Jhang | G11B 33/128 |
| 9,699,931 B1* | 7/2017 | Chen | H05K 7/1489 |
| 9,763,352 B2* | 9/2017 | Jau | G11B 33/128 |
| 9,763,362 B1* | 9/2017 | Xu | H05K 7/1489 |
| 10,104,803 B1* | 10/2018 | Lin | H05K 7/16 |
| 10,212,840 B2* | 2/2019 | Kuan | H05K 7/1489 |
| 2011/0043994 A1* | 2/2011 | Cheng | G06F 1/187 361/679.33 |
| 2011/0222227 A1* | 9/2011 | Xu | G06F 1/181 361/679.4 |
| 2011/0222234 A1* | 9/2011 | Davis | G11B 33/128 361/679.33 |

(Continued)

Primary Examiner — Adrian S Wilson
(74) Attorney, Agent, or Firm — Maschoff Brennan

(57) ABSTRACT

A server comprises case, first storage module, second storage module and at least one third storage module. The case comprises base plate and two side plates. The base plate has first side, second side and fourth side. The first side is opposite to the second side. The third side and the fourth side are located between the first side and the second side, and the third side is opposite to the fourth side. Two side plates respectively stand on first side and second side. The first storage module is fixed to case and located between third side and fourth side. The second storage module is located between first storage module and fourth side and movably disposed on the case. The at least one third storage module is located between the second storage module and the fourth side and movably disposed on the case.

9 Claims, 13 Drawing Sheets

(56) References Cited

U.S. PATENT DOCUMENTS

| | | | |
|---|---|---|---|
| 2014/0036434 A1* | 2/2014 | Jau | G06F 1/16 361/679.33 |
| 2014/0117822 A1* | 5/2014 | Fan | G11B 33/128 312/223.2 |
| 2014/0204537 A1* | 7/2014 | Rust | G11B 33/128 361/727 |
| 2015/0043146 A1* | 2/2015 | Li | H05K 7/1487 361/679.31 |
| 2015/0070830 A1* | 3/2015 | Iwasaki | H05K 7/1487 361/679.33 |
| 2015/0366095 A1* | 12/2015 | Junkins | H05K 5/0256 361/679.31 |
| 2016/0021778 A1* | 1/2016 | Chen | H05K 7/1487 361/679.39 |
| 2016/0081219 A1* | 3/2016 | Jau | G06F 1/183 361/679.02 |
| 2017/0265323 A1* | 9/2017 | Blume | H05K 7/1487 |
| 2017/0347481 A1* | 11/2017 | Kuan | H05K 7/1489 |

* cited by examiner

SERVER

CROSS-REFERENCE TO RELATED APPLICATIONS

This non-provisional application claims priority under 35 U.S.C. § 119(a) on Patent Application No(s). 201811109746.0 filed in China, on Sep. 21, 2018, the entire contents of which are hereby incorporated by reference.

TECHNICAL FIELD

The disclosure relates to a server, more particularly to a server which is easy for maintenance of storage module.

BACKGROUND

With the development of the internet, cloud services that combine the server and the internet together have become widely used in recent years, so the amount of the data that the server needs to process grows at a remarkable speed. This causes a high demand for a server having larger storage space and faster write/read speed. In order to accommodate more storage units in the server, assemblies in the serve usually are disposed in the casing side by side and densely.

However, because assemblies in the server usually are disposed in the casing side by side and densely, some disks in the disk assemblies are interfered by other assemblies when the disks need to be changed or repaired. In this way, the user needs to remove the whole disk assembly from the casing or to move other assemblies away to repair or change the disks. Therefore, the efficiency and the convenience for the user to maintain the disks are deteriorated.

SUMMARY OF THE INVENTION

A server according to an embodiment of the disclosure includes a casing, a first storage module, a second storage module and at least one third storage module. The casing includes a bottom plate and two side plates. The bottom plate has a first side, a second side, a third side and a fourth side. The first side is located opposite to the second side. The third side and the fourth side are located between the first side and the second side. The third side is located opposite to the fourth side and the two side plates respectively stand on the first side and the second side. The first storage module is fixed to the casing and is located between the third side and the fourth side. The second storage module is located between the first storage module and the fourth side and is pivotably disposed on the casing. The at least one third storage module is located between the second storage module and the fourth side and is pivotably disposed on the casing.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
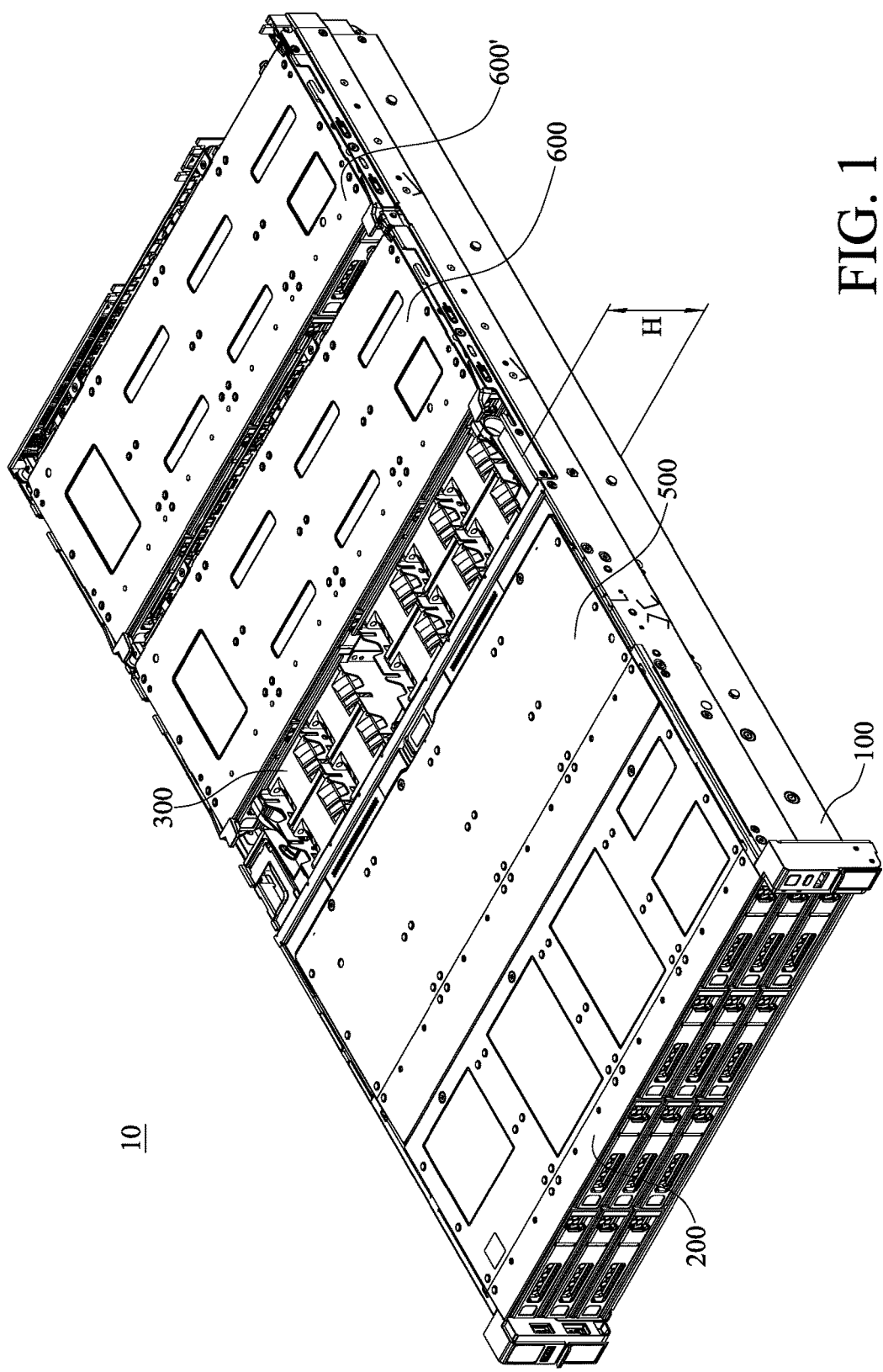
FIG. 1 is a prospective view of a server according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
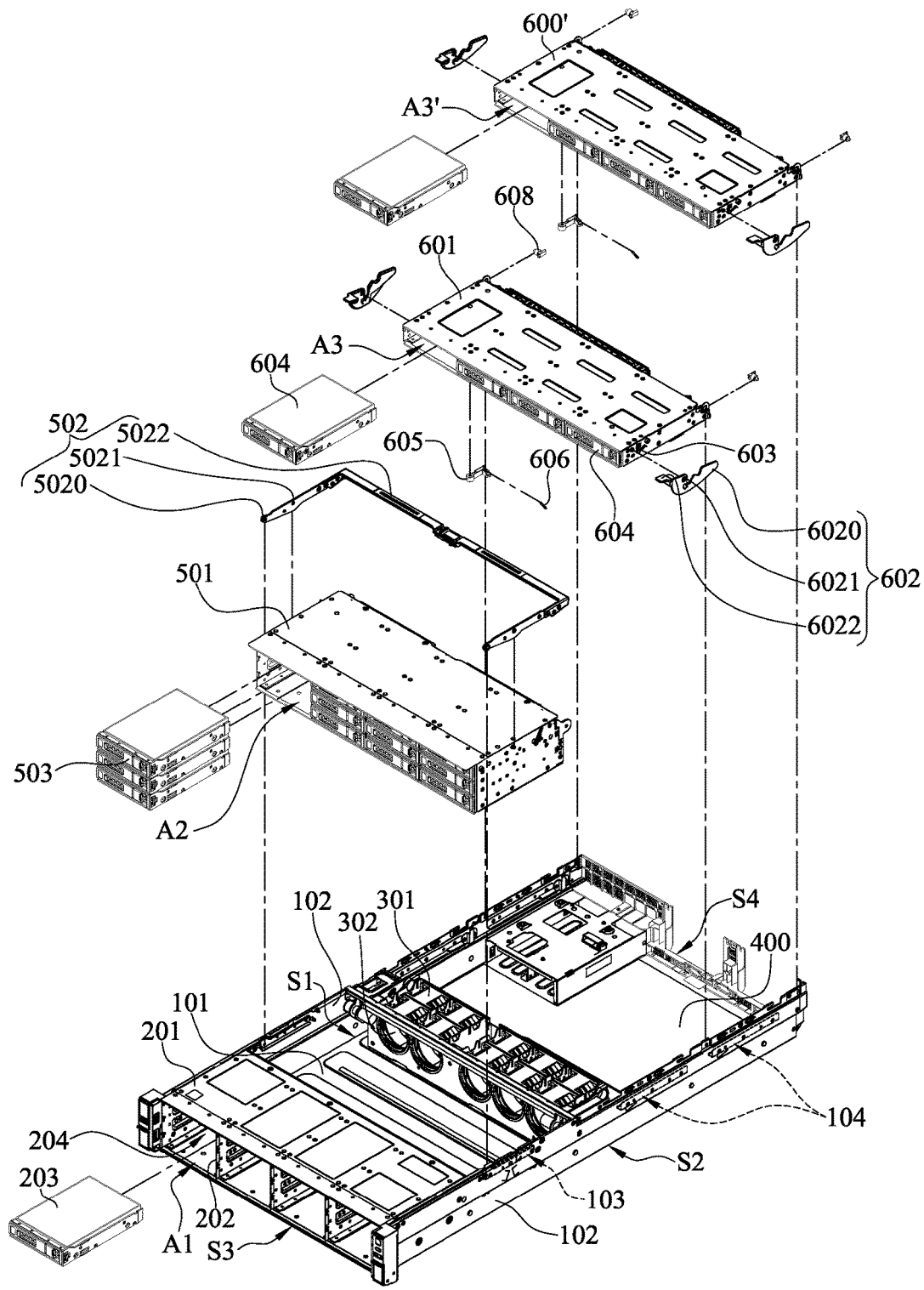
FIG. 2 is an exploded view of the server in FIG. 1.

Please refer to FIG. 1 to FIG. 2. FIG. 1 is a prospective view of a server according to a first embodiment of the disclosure. FIG. 2 is an exploded view of the server in FIG. 1.

This embodiment provides a server 10, and the server 10 has a height H of, for example, 2U. It is widely known that the "U" is an abbreviation of a rack unit, and "1U" is a unit of measure defined as 1.75 inches (44.45 millimeters). In this embodiment, the "U" is used to describe the height H of the server 10, and thus the height H of the server 10 is approximately 3.5 inches (88.9 millimeters). The server 10 includes a casing 100, a first storage module 200, a fan module 300, a motherboard 400, a second storage module 500 and two third storage modules 600 and 600'.

The casing 100 includes a bottom plate 101 and two side plates 102. The bottom plate 101 has a first side S1, a second side S2, a third side S3, and a fourth side S4. The first side S1 is opposite to the second side S2. The third side S3 and the fourth side S4 are located between the first side S1 and the second side S2, and the third side S3 is opposite to the fourth side S4. The two side plates 102 respectively stand on the first side S1 and the second side S2.

The first storage module 200 is fixed to the casing 100 and is located between the third side S3 and the fourth side S4. The first storage module 200 includes two traverse plates 201, a plurality of partitions 202 and a plurality of storage units 203. The two traverse plates 201 are fixed to the two side plates 102. The partitions 202 are fixed to the two traverse plates 201. The two traverse plates 201, the partitions 202 and the two side plates 102 together form a plurality of accommodating spaces 204 and a plurality of first openings A1 that are respectively connected to the accommodating spaces 204. The storage units 203 are able to be disposed into or removed from the accommodating spaces 204 via the first openings A1.

The fan module 300 includes a fan casing 301 and a plurality of fans 302. The fan casing 301 is disposed on the two side plates 102 and is located between the first storage module 200 and the fourth side S4. The fans 302 are disposed in the fan casing 301 and are able to generate an airflow in the casing 100 for removing heat generated by electrical components. However, the fan module 300 is optional. In other embodiments, the airflow may be provided by an external blower that is located outside the server.

The motherboard 400 is disposed on the bottom plate 101 and is located between the fan module 300 and the fourth side S4.

The second storage module 500 is located between the first storage module 200 and the fourth side S4 and is pivotably disposed on the two side plates 102. Further, the second storage module 500 is located between the first storage module 200 and the fan module 300 and is pivotably connected to the fan casing 301. That is, the second storage module 500 is pivotably disposed on the two side plates 102 by being pivotably connected to the fan casing 301. In the case that the server does not have the aforementioned fan module, the second storage module may be directly pivotably connected to the two side plates.

Two side plates 102 each have a first guide groove 103. The second storage module 500 includes a first cage 501, a first handle 502 and a plurality of storage units 503. The first cage 501 is pivotably disposed on the two side plates 102 by being pivotably connected to the fan casing 301. The first cage 501 has a plurality of second openings A2. The second openings A2 are blocked by the first storage module 200. The first handle 502 includes two first contact portions 5020, two first pivot portions 5021 and a first grip portion 5022. The two first pivot portions 5021 are respectively connected to the two first contact portions 5020, and two opposite sides of the first grip portion 5022 are respectively connected to the two first pivot portions 5021. The two first contact portions 5020 are respectively movably disposed in the two first guide grooves 103. The two first pivot portions 5021 are respectively pivotably connected to the two opposite sides of the first cage 501. Moving the first handle 502 can pivot the first cage 501 with respect to the two side plates 102 so as to expose the second openings A2.

However, the configuration of the first handle 502 may be changed according to actual requirements. For example, in other embodiments, the first handle may only be consisted of one first contact portion, one first pivot portion and one first grip portion. Two opposite sides of the first pivot portion are respectively connected to the first contact portion and the first grip portion.

The two third storage modules 600 and 600' are located between the second storage module 500 and the fourth side S4 and disposed side by side on a side of the fan module 300 away from the second storage module 500. Also, the two third storage modules 600 and 600' are pivotably disposed on the two side plates 102. In more detail, the third storage module 600 is located between the fan module 300 and the third storage module 600', and the third storage module 600 has a plurality of third openings A3 facing and being blocked by the fan module 300. Then, the third storage module 600' is located between the third storage module 600 and the fourth side S4, and the third storage module 600' has a plurality of third openings A3' facing and being blocked by the third storage module 600.

Additionally, the two third storage modules 600 and 600' are located above the motherboard 400, and the motherboard 400 is electrically connected to the first storage module 200, the second storage module 500 and the two third storage modules 600 and 600' so as to be able to provide electricity and signals to them.

Each side plate 102 further has two second guide grooves 104 and two pivot holes 105. In each side plate 102, the two second guide grooves 104 respectively correspond to the two third storage modules 600 and 600', and the two pivot holes 105 respectively correspond to the two third storage modules 600 and 600'.

The two third storage modules 600 and 600' are identical, so only the third storage module 600 is described in detail below.

The third storage module 600 include a second cage 601, two second handles 602, two first stoppers 603, a plurality of storage units 604, a holder 605, an elastic component 606, a second stopper 607 and two pivot components 608.

The second cage 601 is pivotably disposed on the two side plates 102, and the third openings A3 are located on the second cage 601.

The two second handles 602 are respectively disposed on two opposite sides of the second cage 601. The two second handles 602 each have a second contact portion 6020, a second pivot portion 6021 and a second grip portion 6022. The second pivot portion 6021 is located between the second contact portion 6020 and the second grip portion 6022. The two second contact portions 6020 are respectively movably disposed in the two second guide grooves 104. The two second pivot portions 6021 are pivotably connected to the second cage 601. Moving the two second handles 602 can pivot the second cage 601 with respect to the two side plates 102 so as to change the position of the third storage module 600 and expose the third openings A3.

The two first stoppers 603 are disposed on the second cage 601 and respectively correspond to the two second handles 602. The storage units 604 are disposed in the second cage 601. The holder 605 is disposed on the second cage 601 and corresponds to one of the two side plates 102.

The elastic component 606 is, for example, an expansion spring, and two opposite sides of the elastic component 606 are respectively connected to the second cage 601 and the holder 605 so that the elastic component 606 is able to provide elastic force to constantly move the holder 605 back to its original position. However, the holder 605 and the elastic component 606 are optional to the third storage module 600. For example, in other embodiments, the third storage module may have no holder and elastic component or may only have the holder.

The second stopper 607 is disposed on the second cage 601 and corresponds to the holder 605. The second stopper 607 is configured to restrict the movement of the holder 605.

The pivot components 608 are respectively detachably pivotably connected to the pivot holes 105 so that the third storage module 600 is able to be pivotably disposed on or detached from the two side plates 102.

In this embodiment, the storage units 203, 503 and 604 are large form factor (LFF) disks and the server 10 can totally accommodate thirty-two large form factor (LFF) disks. In more detail, the first storage module 200 is able to accommodate twelve storage units 203, the second storage module 500 is able to accommodate twelve storage units 503, and each of the third storage modules 600 and 600' is able to accommodate four storage units 604, but the disclosure is not limited thereto. In other embodiments, the storage modules may also accommodate small form factor (SFF) disks, and the amount of the storage units may be changed based on the actual requirements.

The first openings A1 of the first storage module 200 are exposed, so the storage units 203 can easily be repaired or changed via the first openings A1 without moving the first storage module 200.

Figure 3:
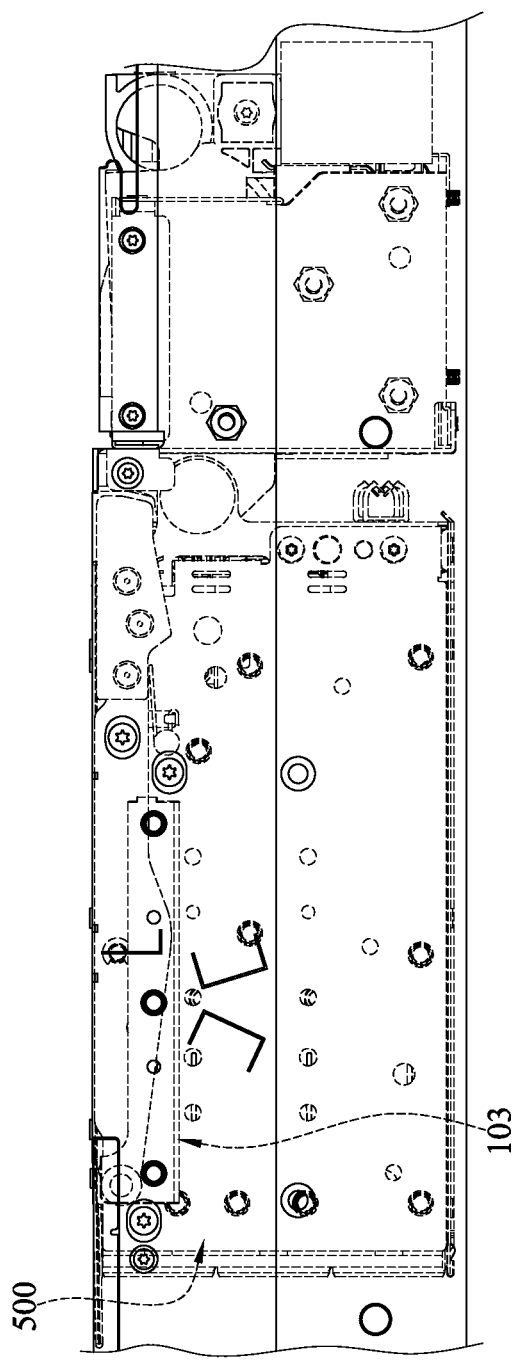
FIG. 3 is a partially enlarged side view of a second storage module of the server in FIG. 1 that is located in a horizontal position.
Figure 4:
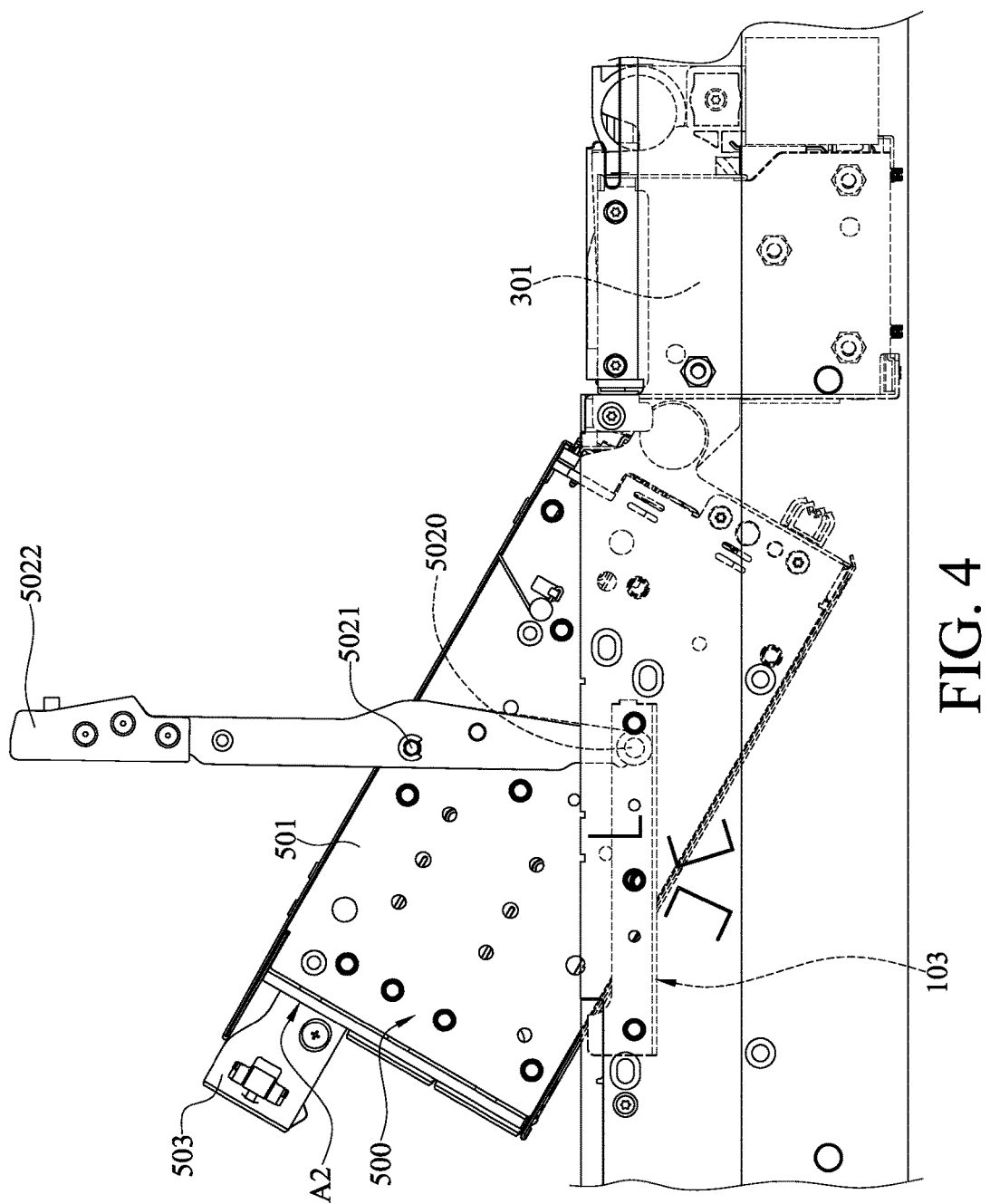
FIG. 4 is a partially enlarged side view of the second storage module of the server in FIG. 1 that is located in a tilt position.

Then, please refer to FIG. 3 and FIG. 4. FIG. 3 is a partially enlarged side view of a second storage module of the server in FIG. 1 that is located in a horizontal position. FIG. 4 is a partially enlarged side view of the second storage module of the server in FIG. 1 that is located in a tilt position.

While the first grip portion 5022 is pivoted counterclockwise (based on the viewing angle of FIG. 3), the first contact portion 5020 slides in the first guide groove 103 and moved toward the fan casing 301. During the movement of the first grip portion 5022, the first cage 501 is pivoted with respect to the fan casing 301 and the two side plates 102 from a horizontal position (as shown in FIG. 3) to a tilt position (as shown in FIG. 4) so as to expose the second openings A2. By doing so, the storage units 503 can be taken out from the second storage module 500. On the other hand, the first grip portion 5022 can be pivoted clockwise to move the two first contact portions 5020 away from the fan casing 301 so as to move the first cage 501 back to the horizontal position.

Figure 5:
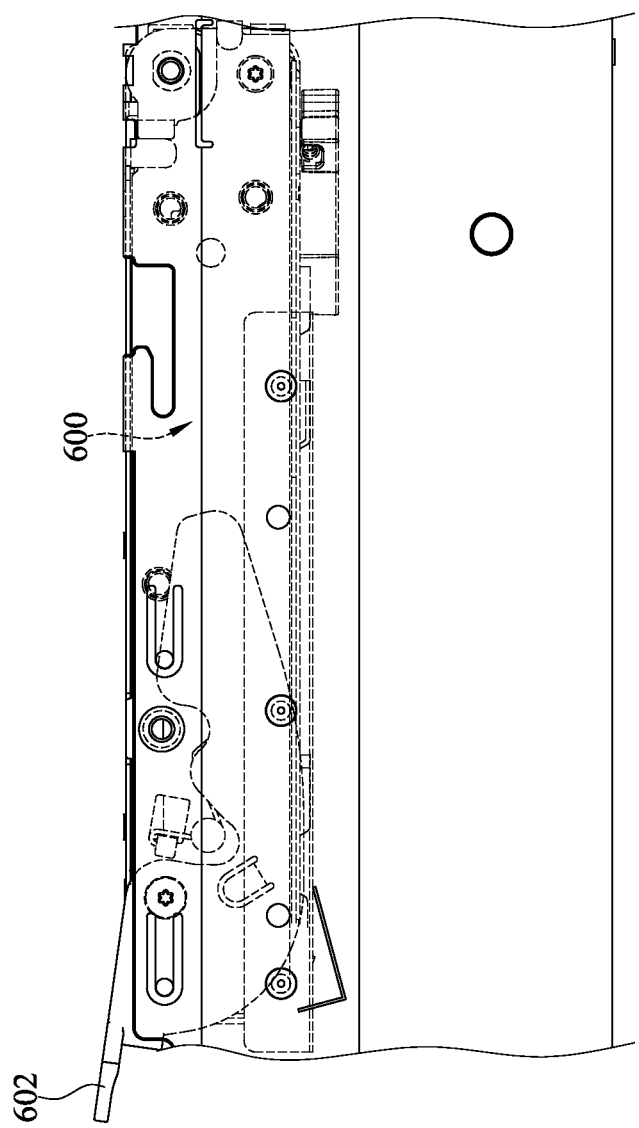
FIG. 5 is a partially enlarged side view of a third storage module of the server in FIG. 1 that is located in a horizontal position.
Figure 6:
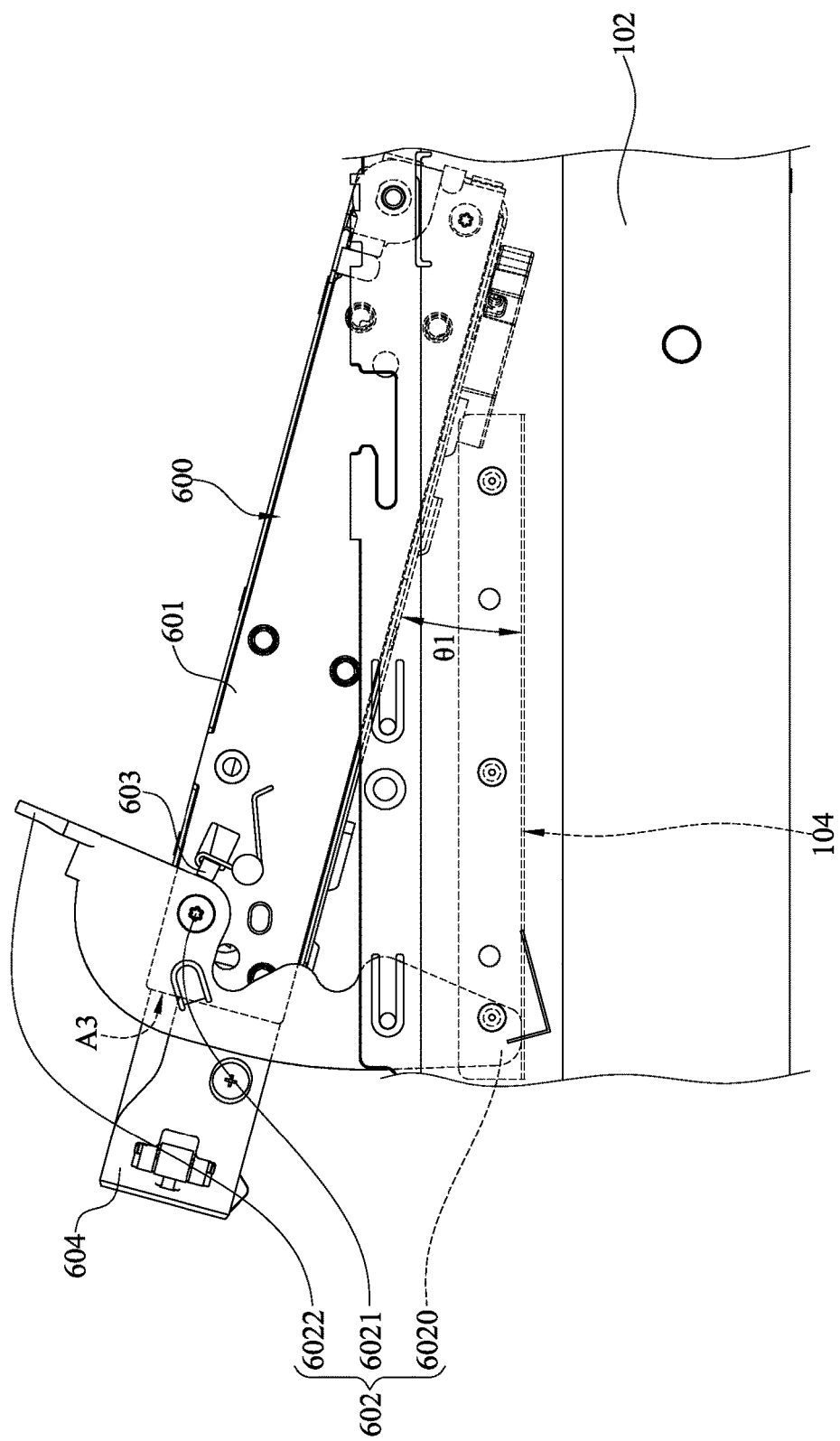
FIG. 6 is a partially enlarged side view of the third storage module of the server in FIG. 1 that is located in a tilt position.

Please refer to FIG. 5 and FIG. 6. FIG. 5 is a partially enlarged side view of a third storage module of the server in FIG. 1 that is located in a horizontal position. FIG. 6 is a partially enlarged side view of the third storage module of the server in FIG. 1 that is located in a tilt position.

While the second grip portion 6022 of the second handle 602 is pivoted clockwise (base on the viewing angle of FIG. 5), the second contact portion 6020 slides in the second guide groove 104. During the movement of the second grip portion 6022, the second cage 601 is pivoted clockwise by a first angle θ1 form a horizontal position (as shown in FIG. 5) to a tilt position (as shown in FIG. 6). The first angle θ1 is, for example, 15 degrees. The second handle 602 is then stopped by the first stopper 603 and the side plate 102 holds the second handle 602 so as to fix the second cage 601 in the tilt position and expose the third openings A3. By doing so, the storage units 604 can be taken out from the third storage module 600. Additionally, the convenience to change the storage units 604 is further approved since the first stopper 603 fixes the second cage 601 in the tilt position. On the other hand, the second handle 602 is pivoted counterclockwise and the second handle 602 is detached form the first stopper 603 so as to move the second cage 601 back to the horizontal position.

Figure 7:
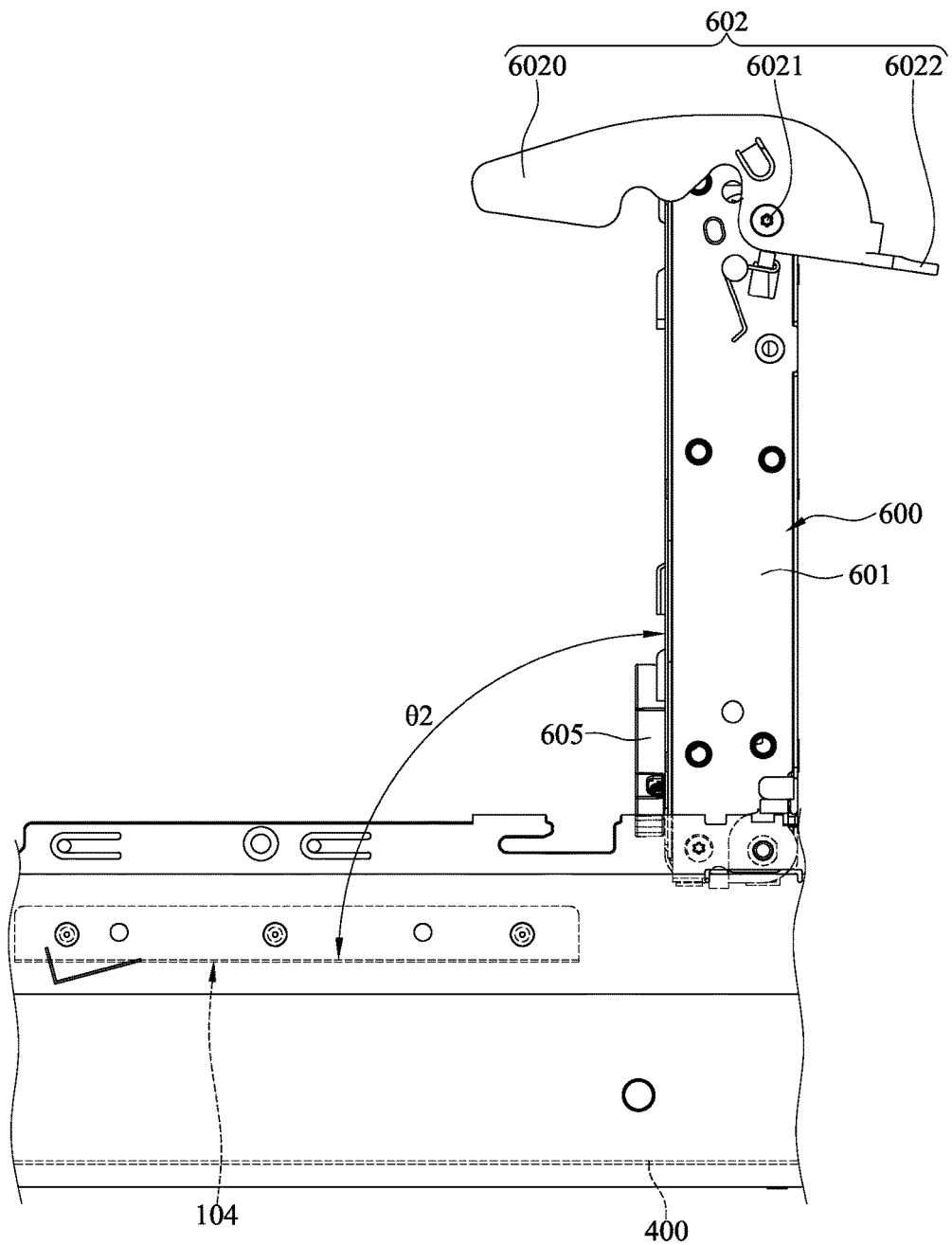
FIG. 7 is a partially enlarged side view of the third storage module of the server in FIG. 1 that is located in a vertical position.
Figure 8:
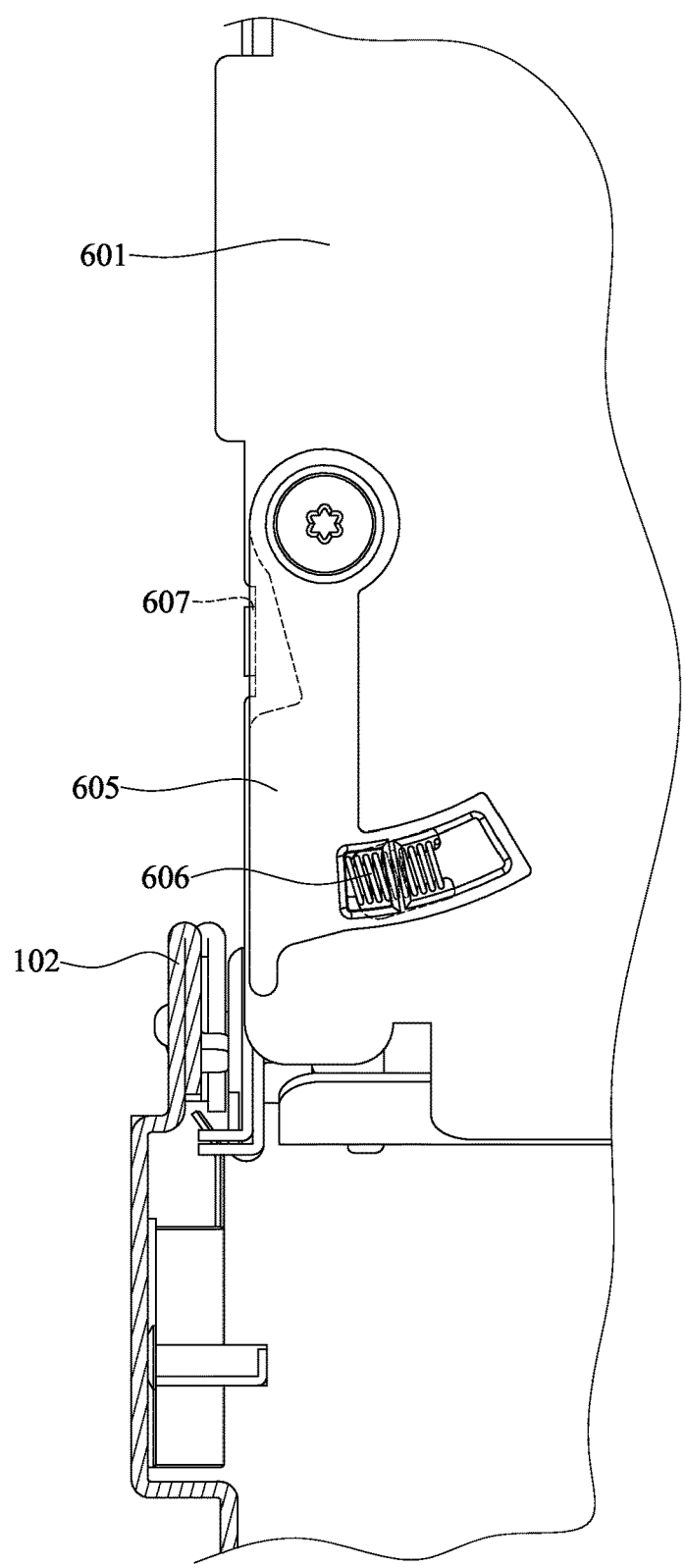
FIG. 8 is a partially enlarged front view of the server in FIG. 5.
Figure 9:
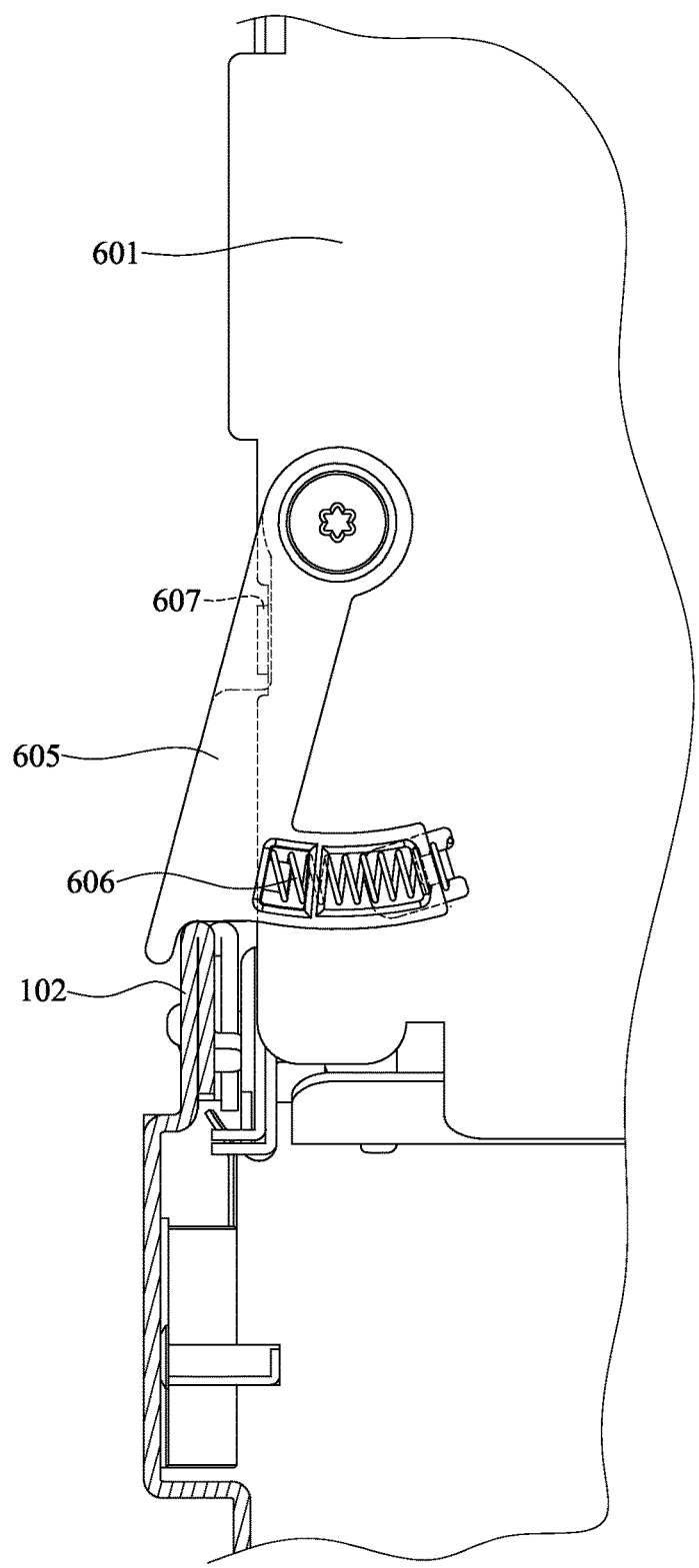
FIG. 9 is a partially enlarged front view of a holder of the server in FIG. 5 that is engaged with a side plate.

Please refer to FIG. 5 and FIG. 7 to FIG. 9. FIG. 7 is a partially enlarged side view of the third storage module of the server in FIG. 1 that is located in a vertical position. FIG. 8 is a partially enlarged front view of the server in FIG. 5. FIG. 9 is a partially enlarged front view of a holder of the server in FIG. 5 that is engaged in a side plate.

In order to repair or change the electrical components on the motherboard 400 that is located below the third storage module 600, it requires the following steps. First is to detach the second contact portions 6020 of the second handles 602 from the second guide grooves 104. Second is to pivot the second cage 601 clockwise until the holder 605 is able to be moved without interfered by one of the side plates 102. The holder 605 would be stopped by the second stopper 607 if it moved too far away from one of the side plates 102. The last is to release the second cage 601, and then the second cage 601 can be held in a vertical position (as shown in FIG. 7) by engaging the holder 605 with one of the side plates 102. By these steps, the motherboard 400 can be exposed, such that the electrical components on the motherboard 400 is able to be repaired or changed. On the other hand, the holder 605 can be detached from one of the two side plates 102 by moving the holder 605. In addition, the holder 605 can be moved to its original position (as shown in FIG. 8) by the elastic force applied from the elastic component 606. Then, the second cage 601 can be pivoted clockwise to the horizontal position, and the two second contact portions 6020 of the two second handles 602 can be respectively disposed back to the two second guide grooves 104.

Figure 10:
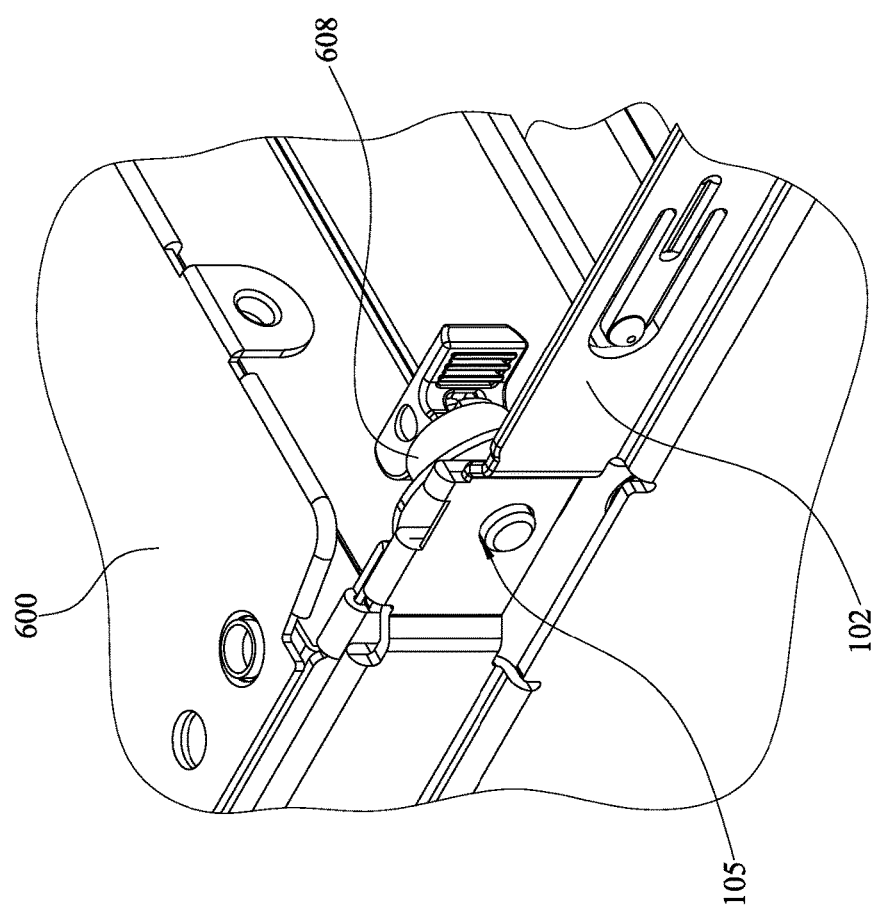
FIG. 10 is a partially enlarged prospective view of the server in FIG. 1.
Figure 11:
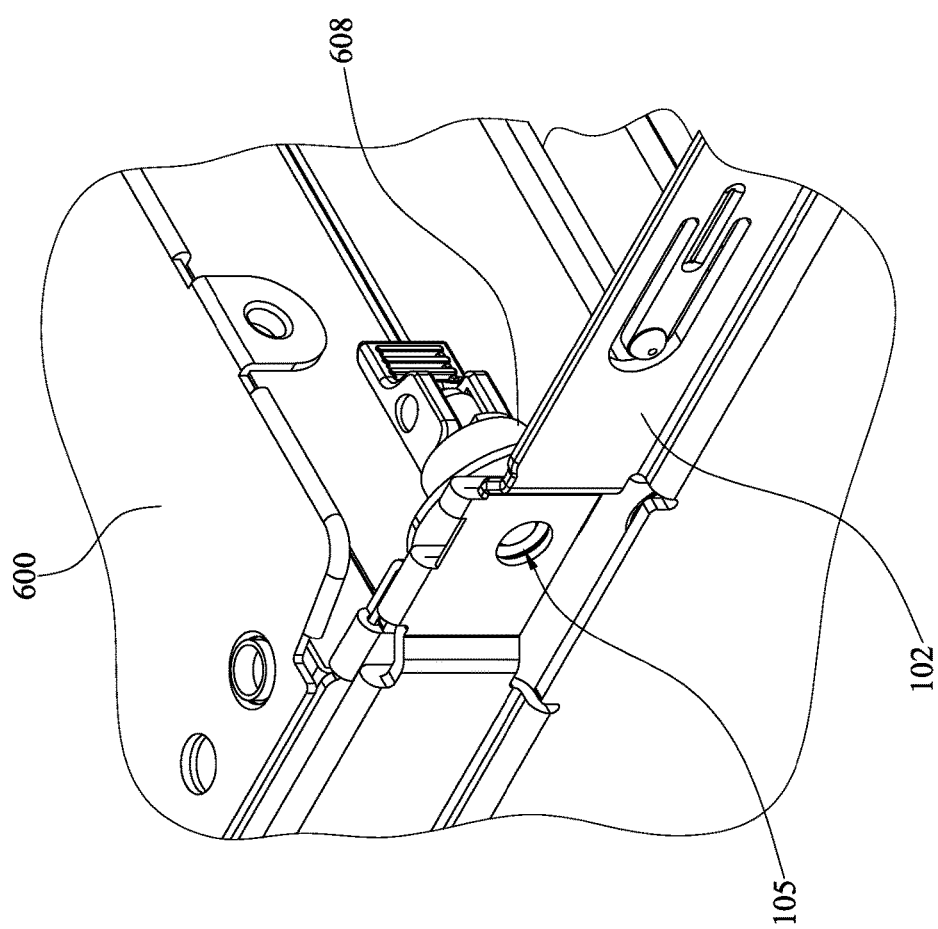
FIG. 11 is a partially enlarged prospective view of a pivot component of the server in FIG. 1 that is detached from a pivot hole.
Figure 12:
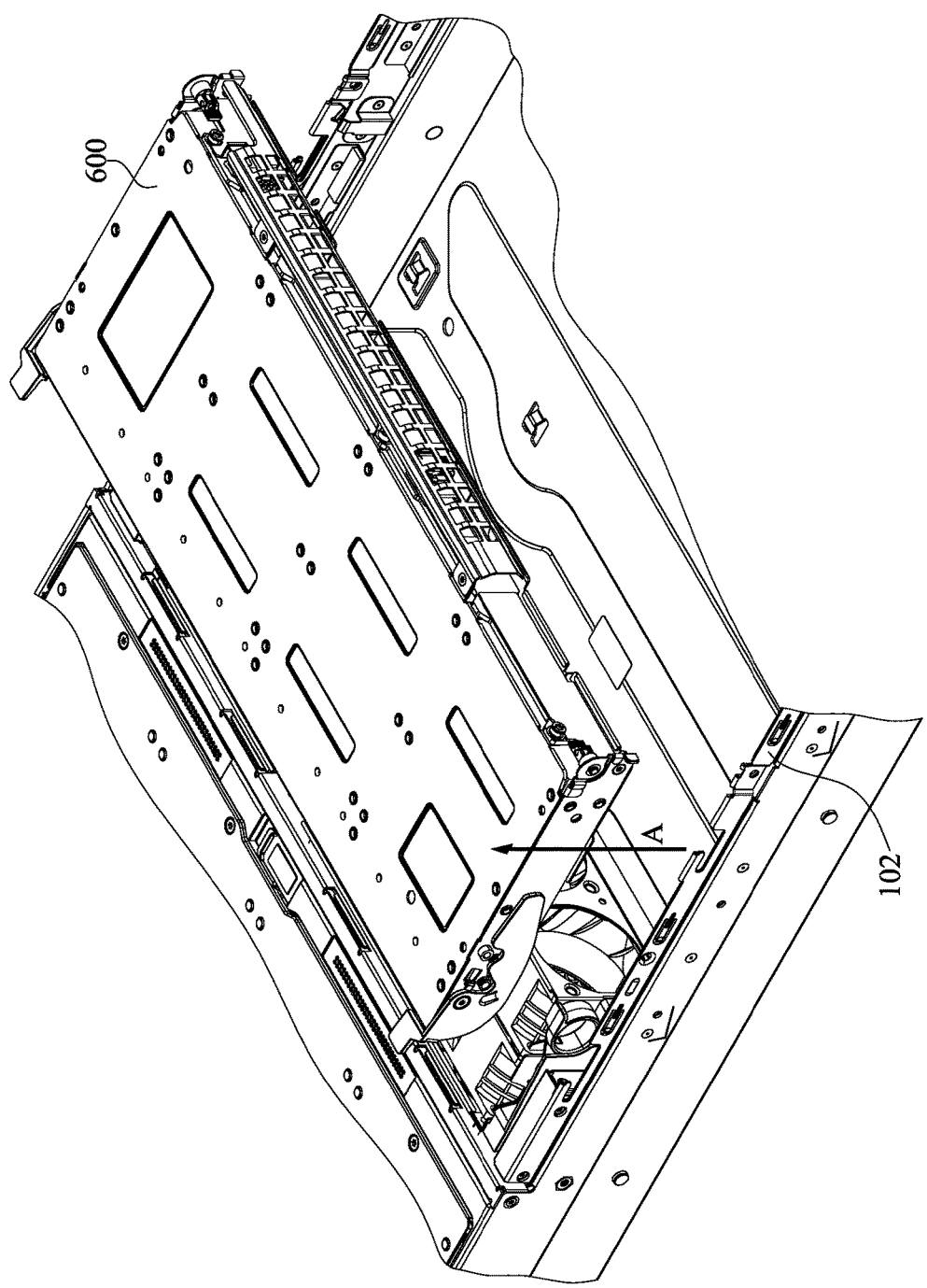
FIG. 12 is a prospective view of the third storage module of the server in FIG. 1 that is detached from the side plate along a detaching direction.

Further, please refer to FIG. 10 to FIG. 12. FIG. 10 is a partially enlarged prospective view of the server in FIG. 1. FIG. 11 is a partially enlarged prospective view of a pivot component of the server in FIG. 1 that is detached from a pivot hole. FIG. 12 is a prospective view of the third storage module of the server in FIG. 1 that is detached from the side plate along a detaching direction.

In order to detach the third storage module 600 from the two side plates 102, it requires the following steps. First is to remove the pivot components 608 from the pivot holes 105 by opening the handles (not numbered) connected to them (as shown in FIG. 11). Then, the third storage module 600 can be removed from the side plates 102 along a detaching direction A (as shown in FIG. 12). The third storage module 600 can be disposed back to the two side plates 102 by respectively locking the handles (not numbered) back to the pivot holes (as shown in FIG. 10).

Figure 13:
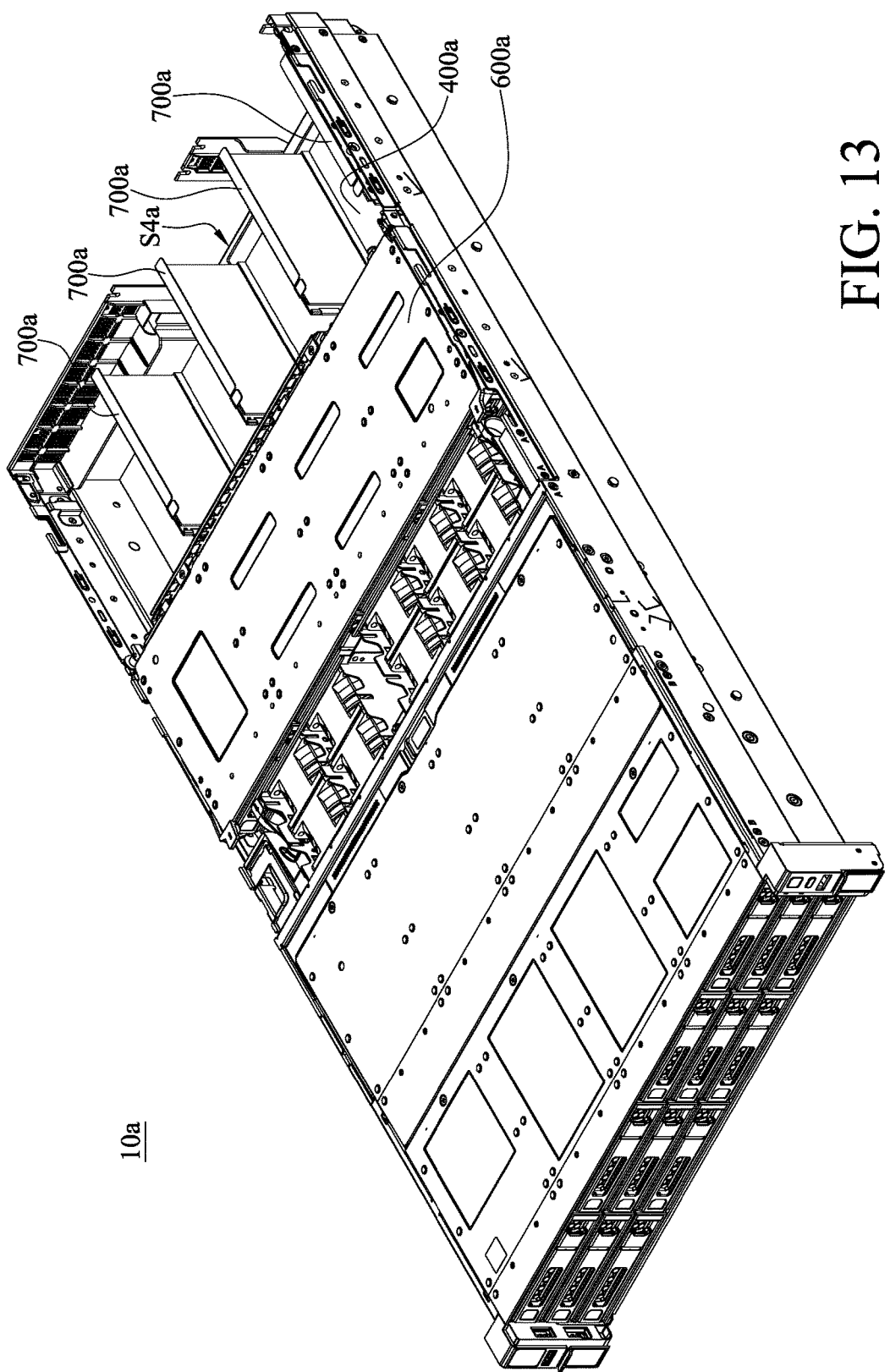
FIG. 13 is a prospective view of a server according to a second embodiment of the disclosure.

However, the server may have only one third storage module. Please refer to FIG. 13. FIG. 13 is a prospective view of a server according to a second embodiment of the disclosure. In this embodiment, a server 10a only includes a third storage module 600a. Therefore, there is an addition space for the server 10a to further include a plurality of expender cards 700a. The expender cards 700a are, for example, internet cards or graphic cards, and are located between the third storage module 600a and the fourth side S4a. The expender cards 700a are disposed on the motherboard 400a to expand the functions of the server 10a.

According to above discussions of the server of the embodiments of the present disclosure, since the second storage module located between the first storage module and the fourth side is pivotably disposed on the casing, and at least one third storage module that is located between the second storage module and the fourth side is pivotably disposed on the casing, it would be easy to perform maintenance of storage module by pivoting the second storage module or the third storage module. That is, the maintenance of storage module can be efficient and convenient.

In addition, since the third storage module can be held in a tilt position by the side plates and the first stoppers, it allows the user to replace or check the storage units in the storage module or the electrical components on the motherboard without holding the second module, thereby helping to further improve the maintenance efficiency.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A server comprising:
   a casing, comprising a bottom plate and two side plates, the bottom plate having a first side, a second side, a third side and a fourth side, the first side located opposite to the second side, the third side and the fourth side located between the first side and the second side, the third side located opposite to the fourth side, and the two side plates respectively standing on the first side and the second side;

a first storage module, fixed to the casing and located between the third side and the fourth side;

a second storage module, located between the first storage module and the fourth side and pivotably disposed on the casing; and at least one third storage module, located between the second storage module and the fourth side and pivotably disposed on the casing;

wherein each of the two side plates has a second guide groove, the at least one third storage module comprises a second cage, two second handles, two first stoppers and a plurality of storage units, the second cage is pivotably disposed on the two side plates, each of the two second handles has a second contact portion, a second pivot portion and a second grip portion, and the second pivot portion is located between the second contact portion and the second grip portion, the two second contact portions are respectively movably disposed in the two second guide groove, the two second pivot portions are pivotably connected to the second cage, the two first stoppers are disposed on the second cage, the plurality of storage units are disposed in the second cage, the second cage is pivotable between a horizontal position and a tilt position by pivoting the second handles; when the second cage is in the tilt position, the two second handles are respectively held by the two first stoppers, and the plurality of storage units of the at least one third storage module are exposed.

2. The server according to claim 1, wherein at least one of the two side plates has a first guide groove, the second storage module comprises a first cage, a first handle and a plurality of storage units, the first cage is pivotably disposed on the two side plates, the first handle comprises at least one first contact portion, at least one first pivot portion and a first grip portion, the first pivot portion is located between the at least one first contact portion and the first grip portion, the at least one first contact portion is pivotably disposed in the first guide groove, the at least one first pivot portion is pivotably connected to the first cage, the first cage is pivotable with respect to the two side plates while the first handle is being pivoted, and the plurality of storage units are disposed in the first cage.

3. The server according to claim 1, wherein the at least one third storage module further comprises a holder, the holder is pivotably disposed on the second cage; when the second cage is in a vertical position, the holder detachably engaged with one of the two side plates so as to held the second cage in the vertical position.

4. The server according to claim 3, wherein the at least one third storage module further comprises an elastic component that is connected to the second cage and the holder so as to provide elastic force to pivot the holder.

5. The server according to claim 4, wherein the second handle is movable to the horizontal position by being pivoted away from the first stopper; when the holder is engaged with one of the two side plates, the second cage is held in the vertical position; when the holder is detached from one of the two side plates, the second cage is allowed to be pivoted from the vertical position to the horizontal position.

6. The server according to claim 1, further comprises a motherboard, and the amount of the at least one third storage module is two, the two third storage modules are disposed side by side on a side of the second storage module away from the third side, the motherboard is disposed between the bottom plate and the two third storage modules.

7. The server according to claim 1, further comprises a motherboard and a plurality of expender cards, the motherboard is located between the at least one third storage module and the bottom plate, the plurality of expender cards are located between the at least one third storage module and the fourth side and are disposed on the motherboard.

8. The server according to claim 1, further comprises a fan module, the fan module comprises a fan casing and a plurality of fans, the fan casing is disposed on the casing, the plurality of the fans are disposed in the fan casing, and the second storage module is pivotably connected to the fan casing.

9. The server according to claim 1, wherein the first storage module comprises two traverse plates, a plurality of partitions and a plurality of storage units, the two traverse plates are fixed to the two side plates, the plurality of partitions are fixed to the two traverse plates, the two traverse plates, the plurality of partitions and the two side plates together form a plurality of accommodating spaces and a plurality of first openings that respectively connected to the plurality of accommodating spaces, the plurality of storage units are able to be disposed into or removed from the plurality of accommodating spaces via the plurality of first openings.

* * * * *